US009269904B2

(12) United States Patent
Huang et al.

(10) Patent No.: US 9,269,904 B2
(45) Date of Patent: Feb. 23, 2016

(54) METHOD FOR MANUFACTURING LARGE-AREA ORGANIC SOLAR CELLS

(71) Applicant: ATOMIC ENERGY COUNCIL-INSTITUTE OF NUCLEAR ENERGY RESEARCH, Taoyuan County (TW)

(72) Inventors: Yu-Ching Huang, Taoyuan County (TW); Hou-Chin Cha, Taoyuan County (TW); Fan-Hsuan Hsu, Taoyuan County (TW); Cheng-Wei Chou, Taoyuan County (TW); De-Han Lu, Taoyuan County (TW); Yeong-Der Lin, Taoyuan County (TW); Chih-Min Chuang, Taoyuan County (TW); Charn-Ying Chen, Taoyuan County (TW); Cheng-Si Tsao, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 14/044,051

(22) Filed: Oct. 2, 2013

(65) Prior Publication Data

US 2015/0004735 A1   Jan. 1, 2015

(30) Foreign Application Priority Data

Jun. 27, 2013   (TW) .............................. 102123075 A

(51) Int. Cl.
*H01L 21/00* (2006.01)
*H01L 51/00* (2006.01)
*H01L 51/42* (2006.01)

(52) U.S. Cl.
CPC ......... *H01L 51/0028* (2013.01); *H01L 51/4253* (2013.01)

(58) Field of Classification Search
CPC .................. H01L 51/4253; H01L 51/0028
USPC ............................................... 438/62, 378, 82
See application file for complete search history.

(56) References Cited

U.S. PATENT DOCUMENTS

| 6,312,971 | B1 * | 11/2001 | Amundson et al. ............. 438/99 |
| 2007/0207571 | A1 * | 9/2007 | Morisue et al. ............... 438/107 |
| 2009/0205713 | A1 * | 8/2009 | Mitra et al. ................... 136/263 |

(Continued)

OTHER PUBLICATIONS

Yu-Ching Huang, Hou-Chin Chia, Chih-Min Chuang, Cheng-Si Tsao, Charn-Ying Chen, Wei-Fang Su; Facile Hot Solvent Vapor Annealing for High Performance Polymer Solar Cell Using Spray Process; Solar Energy Materials & Solar Cells 114 (2013) 24-30.

*Primary Examiner* — Caridad Everhart
(74) *Attorney, Agent, or Firm* — Rosenberg, Klein & Lee

(57) ABSTRACT

A method for manufacturing large-area organic solar cells utilizes a hot solvent vapor annealing manufacturing process while manufacturing the organic solar cells via a large-area proceeding method, such as spraying. Namely, a heated solvent vapor is utilized to modify an active layer after the active layer of the organic solar cells is formed, which ensures a flatness and an uniformity thereof and increases a crystallinity of the active layer and an element charge transport rate so that a power conversion efficiency of the large area organic solar cells is increased, a proceeding time is quite short, and the performance thereof is quite obvious. Therefore, the method not only reduces the cost by a large area production but obtains organic solar cells with higher conversion efficiency.

8 Claims, 5 Drawing Sheets

(56) References Cited

U.S. PATENT DOCUMENTS

| | | |
|---|---|---|
| 2011/0237020 A1* | 9/2011 | Lutsen et al. .................. 438/82 |
| 2012/0168727 A1* | 7/2012 | Lee et al. ....................... 257/40 |
| 2013/0037109 A1* | 2/2013 | Park et al. ..................... 136/263 |
| 2013/0210189 A1* | 8/2013 | Forrest ............... H01L 51/0028 438/82 |

* cited by examiner

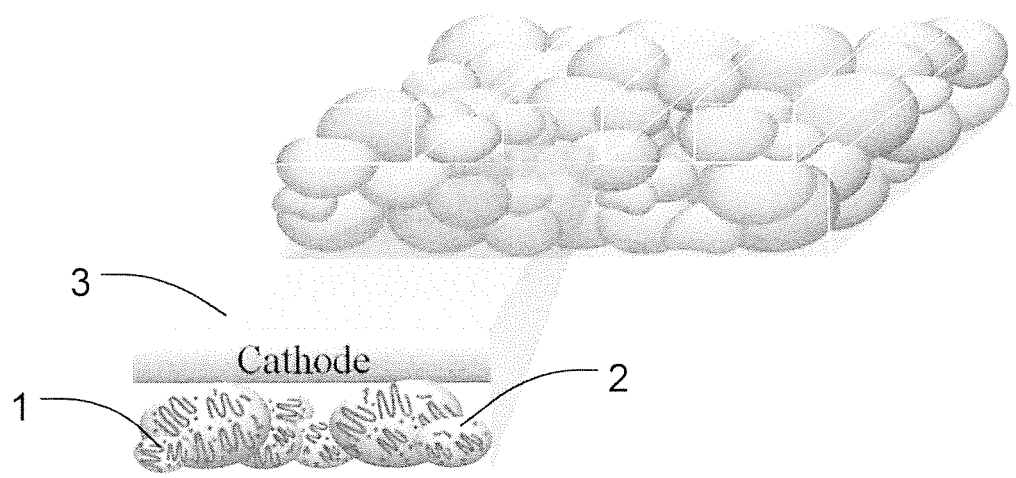
Fig. 3-A
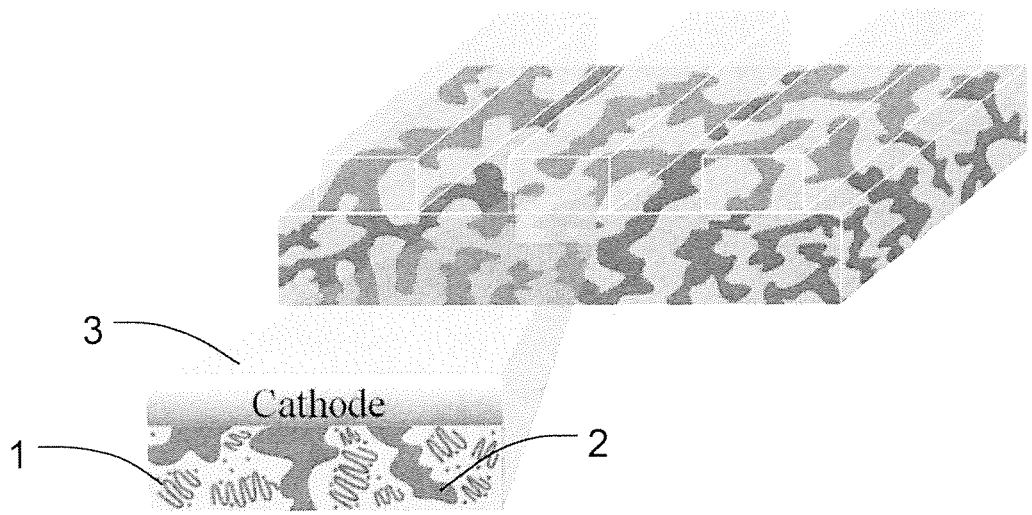
Fig. 3-B

US 9,269,904 B2

METHOD FOR MANUFACTURING LARGE-AREA ORGANIC SOLAR CELLS

BACKGROUND OF THE INVENTION

1. Field of the Invention

The present invention relates to a method for manufacturing organic solar cells, in particular to a method for manufacturing organic solar cells via a large-area manufacturing method, such as spraying, roll-to-roll web-coating, printing or similar methods, and a method for modifying morphology of an active layer by hot solvent vapor annealing manufacturing process.

2. Description of the Related Art

A research in solar cells is an expectant direction of the renewable energy sources. Although most of the commercialized products utilize the silicon as their main material, the organic solar cells still attract the attention of the industrial and academic fields due to the simple manufacturing procedure, the low manufacturing cost, the light material, and the flexibility.

While manufacturing the organic solar cell, an active layer of the solar cell is manufactured by spin coating which renders the layer provide a better flatness and uniformity. However, the spin coating is restricted by being unable to be applied in the manufacture of the solar cell with a large area but a small area, so that an innate choke point is existed in the consideration of reducing the cost in the future commercialization. Therefore, other large-area proceeding methods, such as spray coating or roll-to-roll coating, are considered in the large-area manufacture of the organic solar cells.

However, while manufacturing an active layer of the organic solar cell by spraying, knife coating, roll-to-roll web-coating, dip coating, or printing method, such as ink-jet printing, screen printing, and lithographing, the flatness and uniformity of the layer hardly attain a quality of film manufactured by the present spin coating process, and the thickness of the layer is thicker. Further, a morphology of the active layer, which includes the flatness and uniformity of the layer, and the thickness of the active layer have an important effect on a power conversion efficiency of the entire elements. Therefore, in the organic solar cell manufactured by a large-area production, it is necessary to modify the active layer.

Referring to Taiwan patent number TW 1369011, by "tandem organic solar cell", is disclosed. The prior patent discloses an active layer manufactured by spin coating, bar coating, dip coating, roll coating, spray coating, gravure coating, ink-jet printing, slot coating, or knife coating. However, the prior patent does not disclose a technological method of utilizing the above-mentioned methods to improve the morphology of active layer with a large area, which may reduce the efficiency if adopting this process.

Referring to Taiwan publication number TW 201302839, by "organic semiconductor compositions", is disclosed. This prior patent discloses manufacturing methods of the active layer including spin coating, knife coating, roll-to-roll web-coating, dip coating, and many kinds of printing methods, such as ink jet printing, screen printing, and lithographing. Wherein, after removing a required quantity of a solvent to forma semiconductor layer, the semiconductor layer can be annealed by being exposed to heat or solvent vapor. However, the conventional solvent annealing disclosed in this prior patent is annealed under a room temperature, so the proceeding time usually takes more than 60 minutes, and the efficiency of improving the elements is also not obvious.

Referring to the United States of America patent number US 20110008926, this prior patent also discloses an active layer which adopts the conventional solvent annealing process while spraying and has the same defect as the above-mentioned patent.

Referring to Taiwan patent number TW 201139503, by "copolymer semiconductors comprising thiazolothiazole or benzobisthiazole, or benzobisoxazole electron acceptor subunits, and electron donor subunits, and their uses in transistors and solar cells", is disclosed. While an active layer is manufactured, a solvent is freely heated so as to enlarge dissolution of the copolymer and/or the electron acceptor for assisting a formation of the layer. The above-mentioned process is processed before forming the active layer, and the structure and morphology of the layer are not modified after the active layer is formed, which will meet an unevenness of the active layer while applying to a large-area production of the organic solar cells, thereby causing a decrease of the element efficiency.

SUMMARY OF THE INVENTION

It is an object of the present invention to provide a method for manufacturing large-area organic solar cells, which forms an active layer and anneals the active layer by heating a hot solvent vapor, so that a morphology and a structure of the active layer are improved. Further, the surface morphology of a layer is flatter and provides with high uniformity for enhancing a charge transporting rate so that a power conversion efficiency of the organic solar cell is promoted.

It is a further object of the present invention to provide a method for manufacturing large-area organic solar cells, which adapts to spraying, roll-to-roll web-coating, printing, or other methods similar to the manufacture of organic solar cells with a large area so as to overcome the unevenness of the active layer in the large-area production.

It is a further object of the present invention to provide a method for manufacturing large-area organic solar cells, which obtains a better power conversion efficiency of the solar cells in a short time, greatly reduces the manufacturing time, and saves the manufacturing cost so as to complete the process in 5 minutes without consuming the processing time of the conventional solvent vapor annealing and attain an power conversion efficiency better than the conventional solvent vapor annealing.

The present invention in conformity with the method for manufacturing large-area organic solar cells comprises steps of mixing and setting an electron donor material and an electron acceptor material on a transparent conductive substrate for forming an active layer; heating a solvent into hot solvent vapor, which allows the active layer to be annealed in the hot solvent vapor, and the hot solvent vapor remoistening the active layer and reconstruct a morphology of the active layer; moving the active layer out of an environment where the hot solvent vapor is settled and re-desiccating the active layer for completing a modified process; and setting a cathode metal layer on the active layer. Therefore, the heated hot solvent vapor effectively modifies the morphology of the active layer in a short time under a control of the heated hot solvent vapor with an adapted temperature and an adapted processing time. Furthermore, a good quality of the active layer of the organic solar cells manufactured with a large area is achieved, and the element power conversion efficiency is enhanced.

BRIEF DESCRIPTION OF THE DRAWINGS

FIG. 3-A is a schematic view showing an active layer formed by spraying and a cathode metal layer disposed thereon;

FIG. 3-B is a schematic view showing an active layer of the present invention formed by spraying which is annealed by hot solvent vapor and a cathode metal layer disposed thereon;

DETAILED DESCRIPTION OF THE PREFERRED EMBODIMENTS

Figure 1:
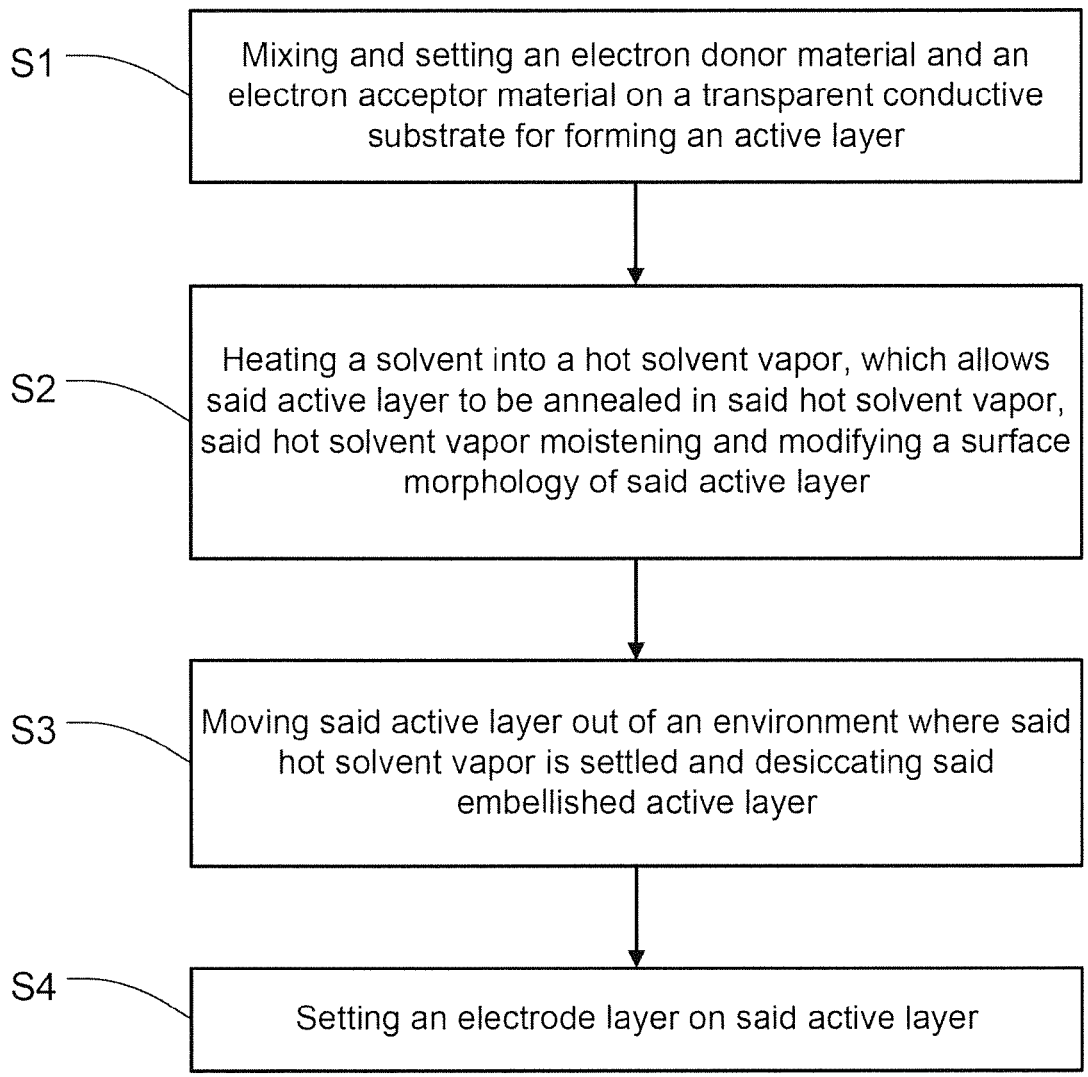
FIG. 1 is a flow view showing the present invention.

Before describing in detail, it should note that the like elements are denoted by the similar reference numerals throughout disclosure.

Referring to FIG. 1, a flow view of a method for manufacturing organic solar cells of the present invention is shown. The present invention comprises steps of:

Step S1: Mixing and setting an electron donor material and an electron acceptor material on a transparent conductive substrate for forming an active layer;

Step S2: Heating a solvent into a hot solvent vapor, which allows said active layer to be annealed in said hot solvent vapor, said hot solvent vapor moistening and modifying a surface morphology of said active layer;

Step S3: Moving said active layer out of an environment where said hot solvent vapor is settled and desiccating said embellished active layer; and Step S4: Setting an electrode layer on said active layer.

The step S1 discloses a forming step of the active layer. The active layer of the organic solar cell is applied to absorb the sunlight for generating an exciton, namely a hole-electron pair. The exciton is separated for generating two electric charges, namely an electron and a hole. The electric charges are transported to a corresponding electrode generates an electric current, which is the key layer for the photovoltaic power conversion. The layer is manufactured by the mixture of the electron donor material. The present invention adopts Poly (3-hexyl-thiophene-2,5-diyl (P3HT) as the electron donor material and [6,6]-phenyl-C61-butyric acid methyl ester (PCBM) as the electron acceptor material for forming a combination of P3HT/PCBM, so that the exciton formed after P3HT absorbing the light energy drifts to a surface-connecting area of P3HT and PCBM and is separated into two electric charges, namely the electron and the hole, whereby the electron is transported to a cathode, and the electron hole is transported to an anode for generating electric current.

The active layer is set on the transparent conductive substrate which is made by a glass substrate and a conductive indium tin oxide (ITO) and defined as an anode of the organic solar cell. The ITO layer is deposited and formed on the glass substrate, which is a common and general transparent conductive substrate of the organic solar cell. Because of the roughness of the surface of the ITO transparent conductive substrate, an electron hole transporting layer is preset before setting the active layer by adding a layer of conductive polymer, such as poly (3,4-ethylenedioxythiophene):poly (styrenesulfonate) (PEDOT:PSS), for modifying the ITO surface and assisting the transport of the electric charges.

Even though the materials of the transparent conductive substrate and the active layer disposed thereon are defined as common source materials, the forming method of the layer affects the surface morphology of the layer and the inner nanostructure. The surface morphology of the layer and the inner nanostructure are important factors that affect the exciton separation and the electric charges transport in the active layer and directly decide the power conversion efficiency of the organic solar cells.

The electron donor material and the electron acceptor material is set on the transparent conductive substrate by spraying, knife coating, roll-to-roll web-coating, dip coating, ink jet printing, screen printing, or lithographing, so that the active layer is able to be manufactured with a large area and without being restricted by the area of the element. In other words, the present invention is based on purposes of enhancing the manufacturing efficiency of the organic solar cell and reducing the cost. Therefore, a technological method of setting the active layer on the ITO layer with a large area is adopted. A thickness of the active layer ranges 200 to 350 nanometers and is thicker than a thickness of the active layer manufactured by spin coating with a thickness smaller than 150 nanometers. Although the addition of the layer thickness enhances the light absorbance of the active layer, the excitors separation and the efficiency of the electric charge transport are reduced, thereby causing a decrease of the element efficiency. Therefore, the surface morphology and the structure of the active layer are important while manufacturing the organic solar cells with a large area.

To overcome the roughness and unevenness of the surface morphology generated from a large-area manufacture of the active layer on the ITO layer, hot solvent vapor is adopted to anneal for modifying the surface morphology of the layer after the active layer is formed.

In this step, the solvent is heated into the hot solvent vapor so as to provide a certain temperature, and the active layer is then set in an environment where the hot solvent vapor is settled for annealing. The solvent adopts 1,2-dichlorobenzene (DCB), and a heating temperature is set at 45-75° C. An annealing processing time of the active layer in DCB hot solvent vapor with a temperature at 45-75° C. is controlled between 2-4 minutes and does not have to spend too much time to anneal. In the annealing process, the surface of the active layer will become moister. The active layer is re-desiccated and progressively modifies the surface morphology thereof into a flat and even active layer after being moved out of the environment where the hot solvent vapor is settled.

Figure 2:
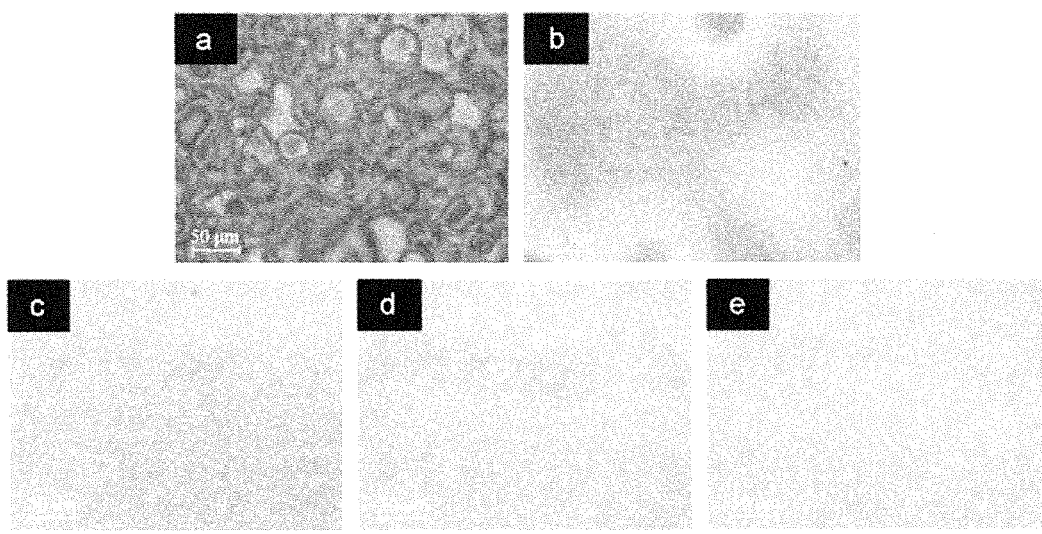
FIG. 2 is a series of pictures shot by an optical microscope for showing a surface of an active layer of the present invention.

Referring to FIG. 2, a comparison of the morphology of the active layer in the annealing process at different processing times and temperatures: as shown in the Figure, a table 1 lists the items as follows:

TABLE 1

| No. | Processing method | Temperature (° C.) | Annealing processing time (minute) |
|---|---|---|---|
| a | No annealing process after spraying | — | — |
| b | Hot solvent vapor annealing | 45 | 2 |
| c | Hot solvent vapor annealing | 45 | 4 |
| d | Hot solvent vapor annealing | 55 | 2 |
| e | Hot solvent vapor annealing | 55 | 4 |

The pictures shot by an optical microscope show that the surface of the active layer by spraying is not flat, has apparent interfaces, and does not have an even layer surface. Nevertheless, the surface of the layer is able to be modified into a flat and even surface in a very short time after processing the hot solvent vapor annealing, thereby obtaining a better morphology.

The surface of the active layer formed in a large area by spraying has a flatter state via the above-mentioned processes. A cathode metal layer is able to be set on the active layer after the active layer is desiccated for about 1 minute.

The cathode metal layer of the present invention mainly adopts calcium (Ca) and aluminum (Al). A construction of the cathode metal layer with a thickness of 100 nanometers and calcium with a thickness of 30 nanometers is formed by thermal evaporation under a vacuum environment of $5 \times 10^{-6}$ torr, thereby completing the production of the organic solar cell.

Benefiting from heating the hot solvent vapor, the annealing efficiency and the flatness and uniformity of the active layer are enhanced, and the organic solar cell also obtains a better inner nanostructure from this process. As FIGS. 3-A and 3-B are shown, the FIG. 3-A shows a simply sprayed active layer. A contacting condition of a P3HT/PCBM dripping and a cathode metal layer 3 made by an electron donor material 1 and an electron acceptor material 2 is quite poor. Further, a transport of an electric charge is obstructed, so that a power conversion efficiency of the entire organic solar cell is low. Nevertheless, a morphology of P3HT/PCBM of the present invention is changed after being annealed by the hot solvent vapor, thereby having a better contact with the cathode metal layer 3 and benefiting the property of the organic solar cell.

Figure 4:
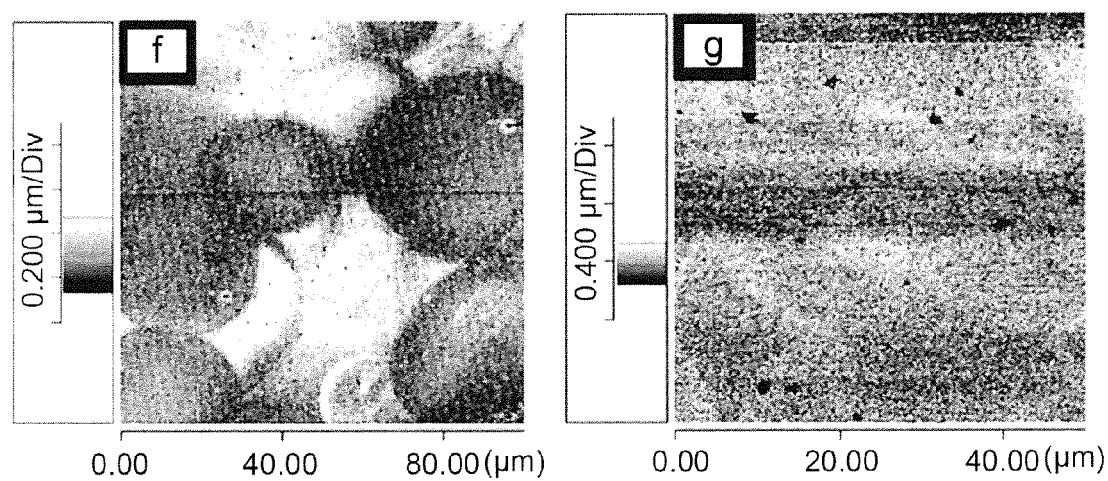
FIG. 4 is a series of pictures shot by an atomic force microscope (AFM) showing a nanostructure of the active layer of the present invention.

Referring to FIG. 4, a conductivity of the active layer observed by atomic force microscopy (AFM) is shown. The number f is defined as a nanostructure of the sprayed active layer without annealing process, which clearly shows a plurality of interfaces. The interfaces are defined as an obstruction of the electric charge transport. Relatively, the number g, in accordance with the method disclosed in the present invention, is defined as a nanostructure of the active layer annealed by the hot solvent vapor for 4 minutes set by a temperature at 55° C., thereby observing that the interfaces are effectively cleared, and the obstruction of the transport of the electric charge is eliminated so as to become an unobstructed transported route.

Figure 5:
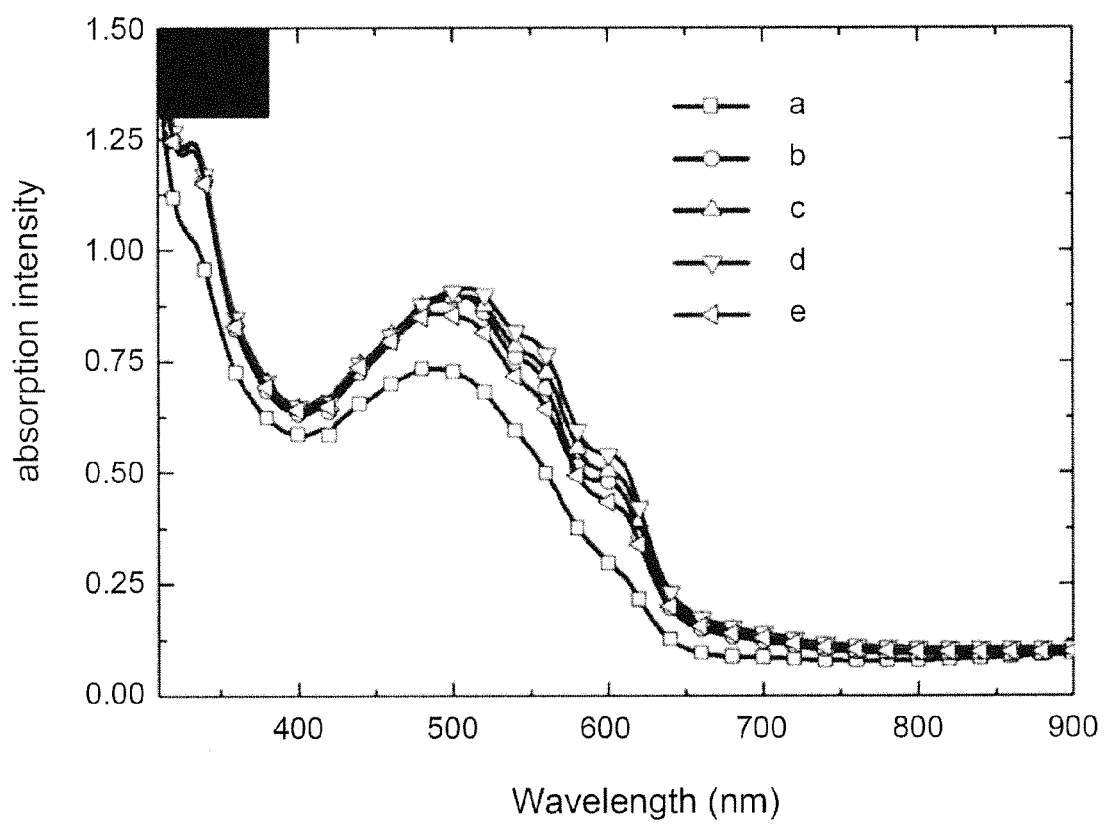
FIG. 5 is a chart showing a test of the light absorption intensity of the present invention.

Referring to FIG. 5, a light absorption intensity of the organic solar cell operated in different circumstances a, b, c, d, and e according to the above-mentioned table 1 is disclosed. According to the figure, the organic solar cell processed by hot solvent vapor annealing obviously has higher light absorption intensity. An increase of an absorption peak (400-600 nm) of P3HT is shown, which represents a crystallinity of P3HT is increased so as to enhance the sunlight absorbance. Further, an absorption region near 350 nm is also raised, namely the hot solvent vapor annealing is able to enhance absorption of PCBM, which attains an effect that the conventional annealing process unable to achieve.

Furthermore, the present invention attains an enhancement of the hot solvent vapor annealing process to the organic solar cell and a practice of the manufacture of the large area by controlling the temperature and the processing time. The present invention cannot attain a better efficiency by processing in a higher temperature or for a longer annealing processing time, but by processing a thermal annealing (TA) with a temperature at 130° C. for 10 minutes to the active layer before the modified active layer is desiccated, thereby enhancing the efficiency of the organic solar cell.

Referring to a following table 2, in power conversion efficiency (PCE), when a temperature is set at 45° C. and a processing time is set for 2-4 minutes, the PCE is increased by the extension of processing time. Nevertheless, when a temperature is set at 55° C., the PCE is decreased by the extension of time but still stands above a certain standard. Further, the table 2 also shows that the PCE is enhanced by the assistance of the TA.

TABLE 2

Performance of PSCs with sprayed active layer under various annealing treatment.

| Treatment | $V_{oc}$ (V) | $J_{sc}$ (mA/cm$^2$) | FF (%) | PCE (%) | $R_s$ (Ωcm$^2$) | $R_{sh}$ (Ωcm$^2$) |
|---|---|---|---|---|---|---|
| TA | 0.62 | 6.271 | 44.41 | 1.73 | 12.85 | 194.17 |
| 45 C. 2 min | 0.62 | 6.068 | 56.31 | 2.12 | 12.27 | 317.46 |
| 45 C. 2 min/TA | 0.63 | 6.66 | 63.62 | 2.67 | 8.86 | 909.09 |
| 45 C. 4 min/TA | 0.63 | 7.33 | 65.51 | 3.03 | 7.54 | 917.43 |
| 55 C. 2 min/TA | 0.64 | 8.79 | 64.13 | 3.61 | 4.66 | 990.02 |
| 55 C. 4 min/TA | 0.63 | 8.19 | 61.94 | 3.20 | 8.40 | 787.40 |

If a solvent temperature is increased, such as a temperature at 65-75° C. shown in the following table 3, for completing the process in a shorter time, the efficiency thereof is not better than an efficiency of a process set by a temperature at 45-55° C. and a processing time for 2-4 minutes. Further, if the time is extended to 8 minutes, the efficiency thereof is worse than the efficiency of the hot solvent vapor annealing set for 4 minutes (as shown in table 2). Therefore, the time and the temperature are parametric conditions that affect the efficiency of controlling the hot solvent vapor annealing process.

TABLE 3

Performance of various HSV annealed PSCs with subsequent thermal annealing.

| Treatment | $V_{oc}$ (V) | $J_{sc}$ (mA/cm$^2$) | FF (%) | PCE (%) |
|---|---|---|---|---|
| 45 C. 8 min/TA | 0.65 | 7.31 | 59.32 | 2.82 |
| 65 C. 1 min/TA | 0.63 | 8.37 | 60.61 | 3.20 |
| 65 C. 2 min/TA | 0.63 | 7.91 | 61.13 | 3.05 |
| 75 C. 1 min/TA | 0.62 | 7.36 | 62.53 | 2.85 |
| 75 C. 2 min/TA | 0.62 | 7.22 | 61.31 | 2.74 |

Through the above-mentioned steps, the present invention considers that while manufacturing the active layer of the organic solar cell by a large-area spraying method, it is more difficult for the surface morphology of the active layer to attain the objective conditions, such as a level of the surface morphology of the active layer manufactured by a spin coating method, and the thicker manufactured layer. Therefore, the hot solvent vapor annealing process is adopted to modify the morphology and the nanostructure of the layer having coarser surfaces and thicker thickness for enhancing the flatness and uniformity thereof and increasing a quality of the nanostructure, the crystallinity, and a contact surface of the cathode metal layer. Therefore, the required processing time is short, and the power conversion efficiency is obviously increased. The present invention provides a practical value of a method for manufacturing large-area organic solar cells under multifaceted conditions, such as the cost and the efficiency.

While we have shown and described the embodiment in accordance with the present invention, it should be clear to those skilled in the art that further embodiments may be made without departing from the scope of the present invention.

The invention clamed is:

1. A method for manufacturing large-area organic solar cells comprising steps of:
   mixing and setting an electron donor material and an electron acceptor material on a transparent conductive substrate for forming an active layer;

heating a solvent into a hot solvent vapor, which allows said active layer to be annealed in said hot solvent vapor, said hot solvent vapor moistening and modifying a surface morphology of said active layer;

moving said active layer out of an environment where said hot solvent vapor is settled;

thermal annealing said active layer, and then desiccating said embellished active layer; and setting an electrode layer on said active layer.

2. The method as claimed in claim 1, wherein in said step for forming said active layer, said electron donor material and said electron acceptor material are mixed and set on said transparent conductive substrate via spraying, knife coating, roll-to-roll web-coating, dip coating, ink jet printing, screen printing, or lithographing.

3. The method as claimed in claim 1, wherein said electron donor material is poly (3-hexyl-thiophene-2,5-diyl), and said electron acceptor material is [6,6]-phenyl-C61-butyric acid methyl ester.

4. The method as claimed in claim 1, wherein said solvent is 1,2-dichlorobenzene.

5. The method as claimed in claim 1, wherein in said step for modifying said active layer into a flat surface by said hot solvent vapor, said hot solvent vapor is heated up to 45-75° C.

6. The method as claimed in claim 1, wherein in said step for moistening and modifying said morphology of said active layer by said hot solvent vapor, said active layer is annealed in said hot solvent vapor for 2-4 minutes.

7. The method as claimed in claim 1, wherein a thickness of said active layer ranges from 150 to 350 nanometers.

8. The method as claimed in claim 1, wherein a temperature in said step for thermal annealing said active layer is defined at 130° C., and a proceeding time thereof is defined at 10 minutes.

* * * * *